(12) United States Patent
Grivna

(10) Patent No.: US 7,851,312 B2
(45) Date of Patent: Dec. 14, 2010

(54) SEMICONDUCTOR COMPONENT AND METHOD OF MANUFACTURE

(75) Inventor: Gordon M. Grivna, Mesa, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 12/359,043

(22) Filed: Jan. 23, 2009

(65) Prior Publication Data

US 2010/0187642 A1 Jul. 29, 2010

(51) Int. Cl.
 *H01L 21/336* (2006.01)
(52) U.S. Cl. .............. 438/279; 438/585; 257/367; 257/E21.384
(58) Field of Classification Search ............. 438/142, 438/152, 197, 199, 201, 206, 209, 275, 279, 438/585; 257/260, 262, 300, 328, 367–369, 257/E27.06, E29.041, E29.051, E29.062, 257/E21.382, E21.384, E21.409, E21.457
See application file for complete search history.

(56) References Cited

U.S. PATENT DOCUMENTS

| | | | |
|---|---|---|---|
| 6,156,606 A * | 12/2000 | Michaelis | 438/243 |
| 6,710,403 B2 * | 3/2004 | Sapp | 257/330 |
| 7,265,398 B1 | 9/2007 | Yu | |
| 2005/0242392 A1 | 11/2005 | Pattanayak et al. | |
| 2006/0060916 A1 * | 3/2006 | Girdhar et al. | 257/330 |
| 2007/0093077 A1 * | 4/2007 | Grivna | 438/787 |
| 2008/0073707 A1 * | 3/2008 | Darwish | 257/330 |

FOREIGN PATENT DOCUMENTS

| | | | |
|---|---|---|---|
| WO | 2005/053032 A2 | 6/2005 | |
| WO | 2005/053032 A3 | 6/2005 | |
| WO | 2005/053031 A2 | 9/2005 | |
| WO | 2005/053031 A3 | 9/2005 | |
| WO | 2005/112128 A2 | 11/2005 | |

* cited by examiner

*Primary Examiner*—W. David Coleman
*Assistant Examiner*—Su C Kim
(74) *Attorney, Agent, or Firm*—Rennie William Dover

(57) ABSTRACT

A semiconductor component that includes a field plate and a semiconductor device and a method of manufacturing the semiconductor component. A body region is formed in a semiconductor material that has a major surface. A gate trench is formed in the epitaxial layer and a gate structure is formed on the gate trench. A source region is formed adjacent the gate trench and extends from the major surface into the body region and a field plate trench is formed that extends from the major surface of the epitaxial layer through the source and through the body region. A field plate is formed in the field plate trench, wherein the field plate is electrically isolated from the sidewalls of the field plate trench. A source-field plate-body contact is made to the source region, the field plate and the body region. A gate contact is made to the gate region.

19 Claims, 11 Drawing Sheets

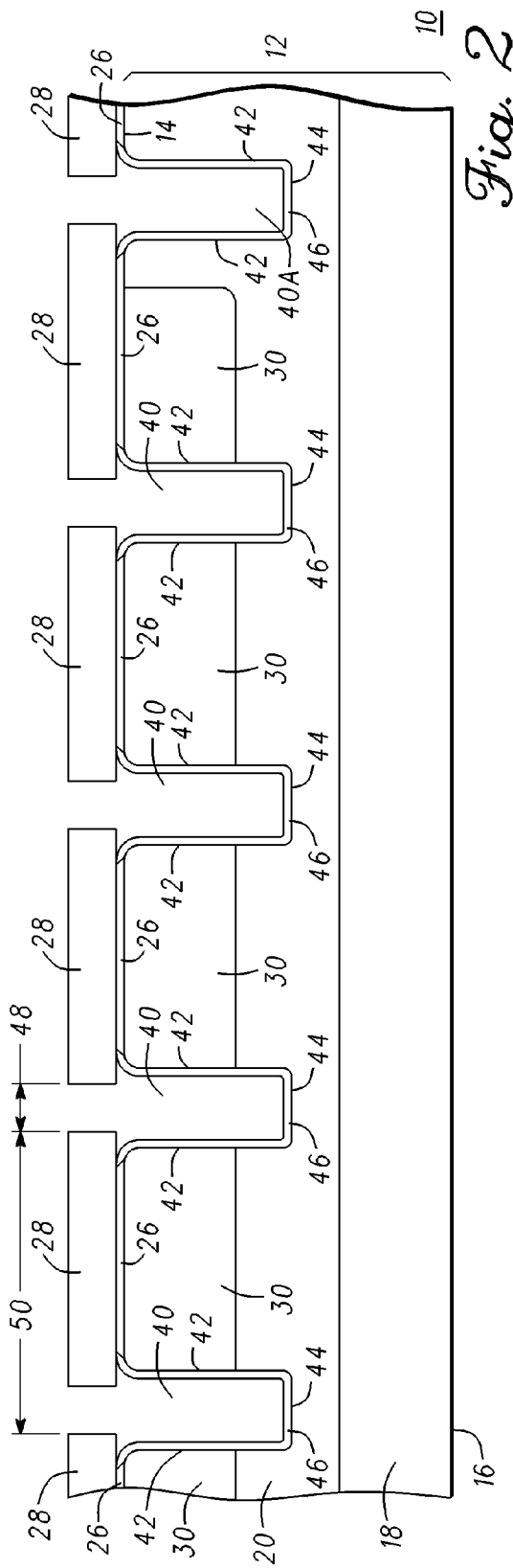
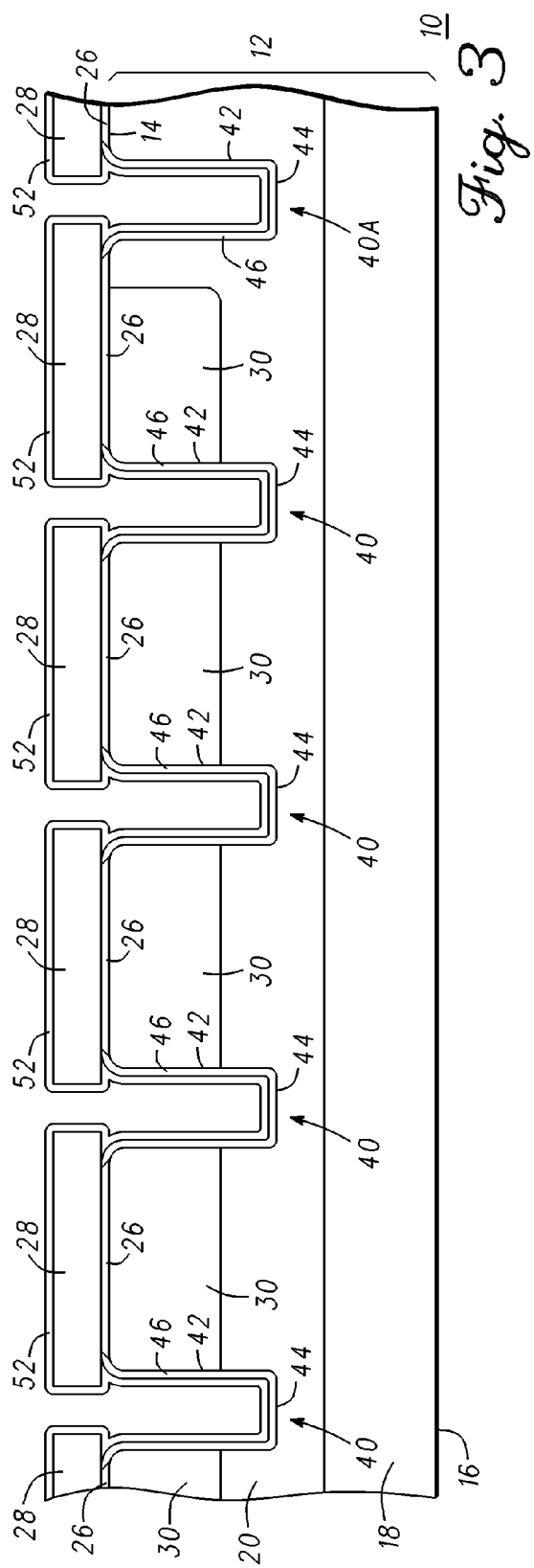

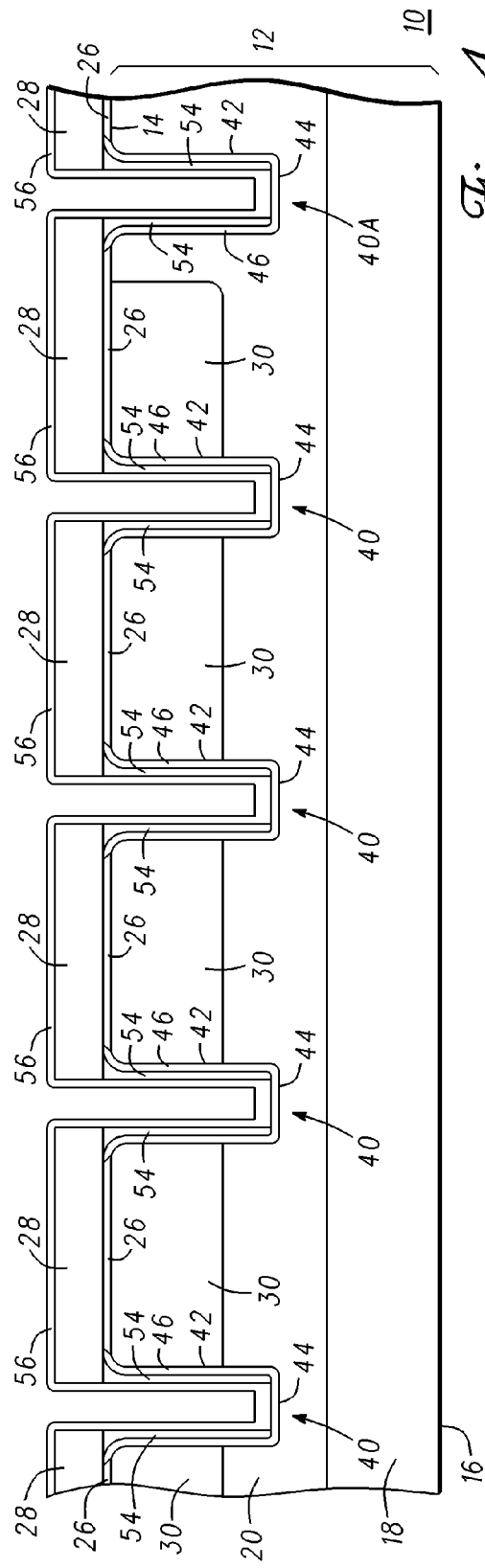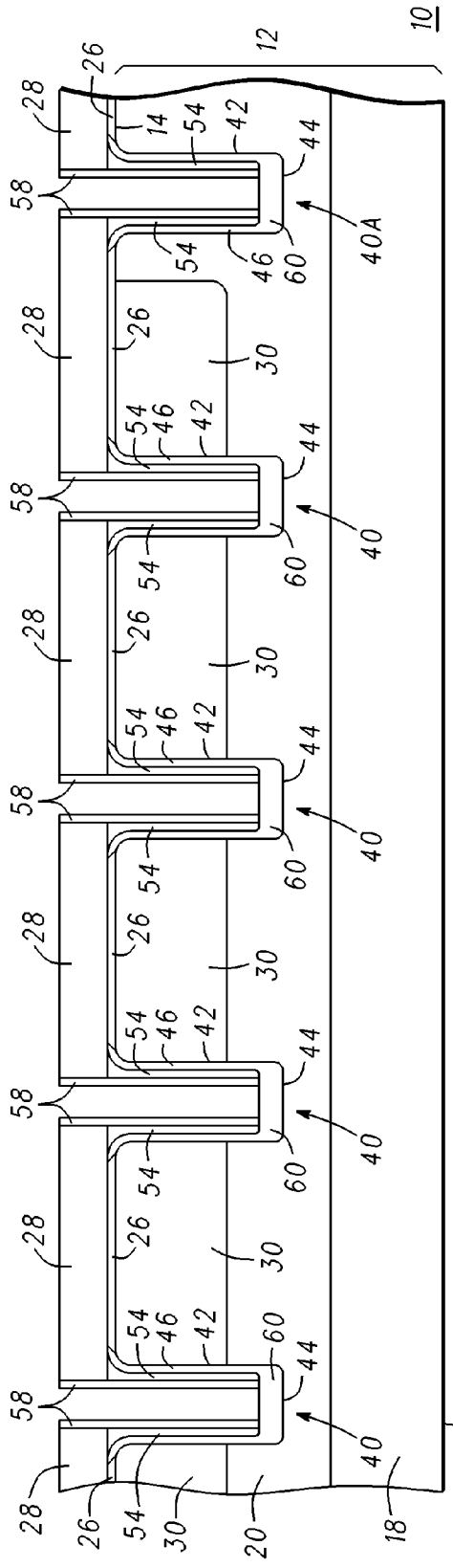

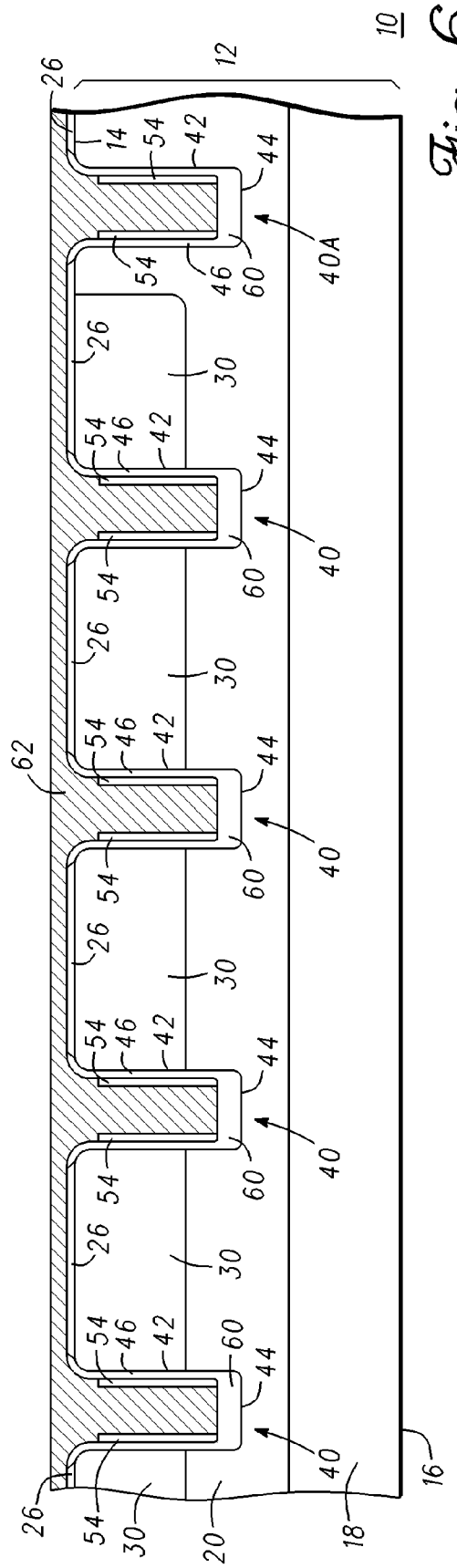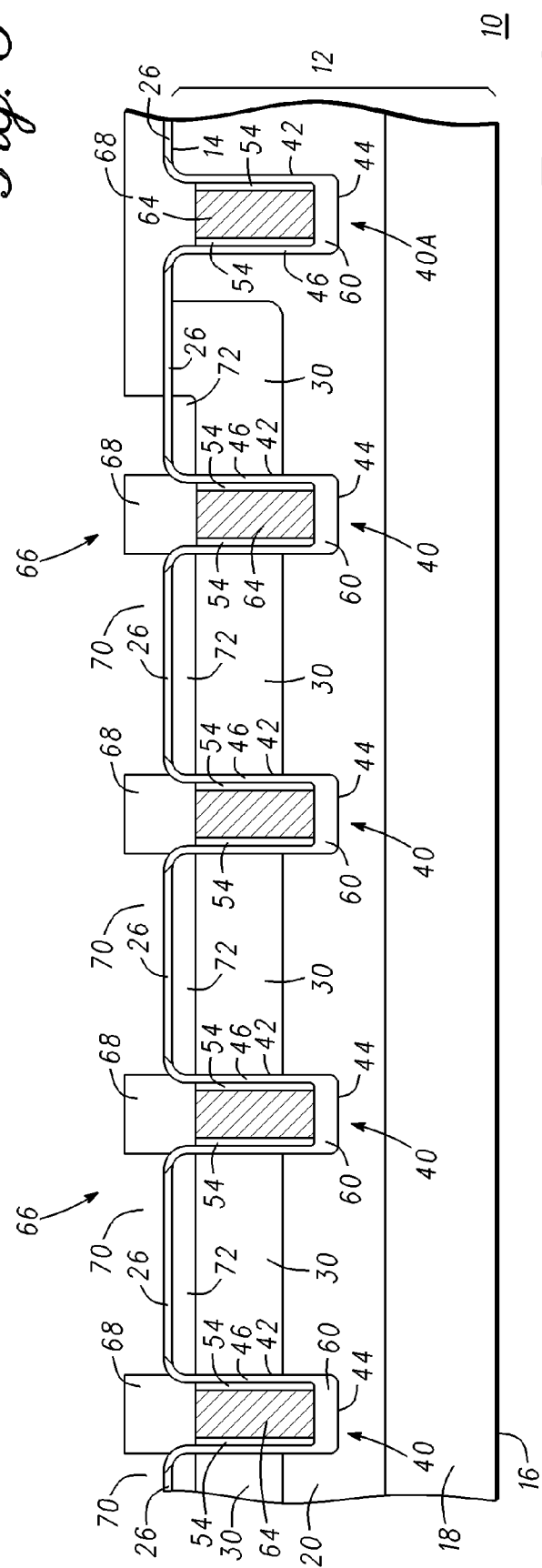

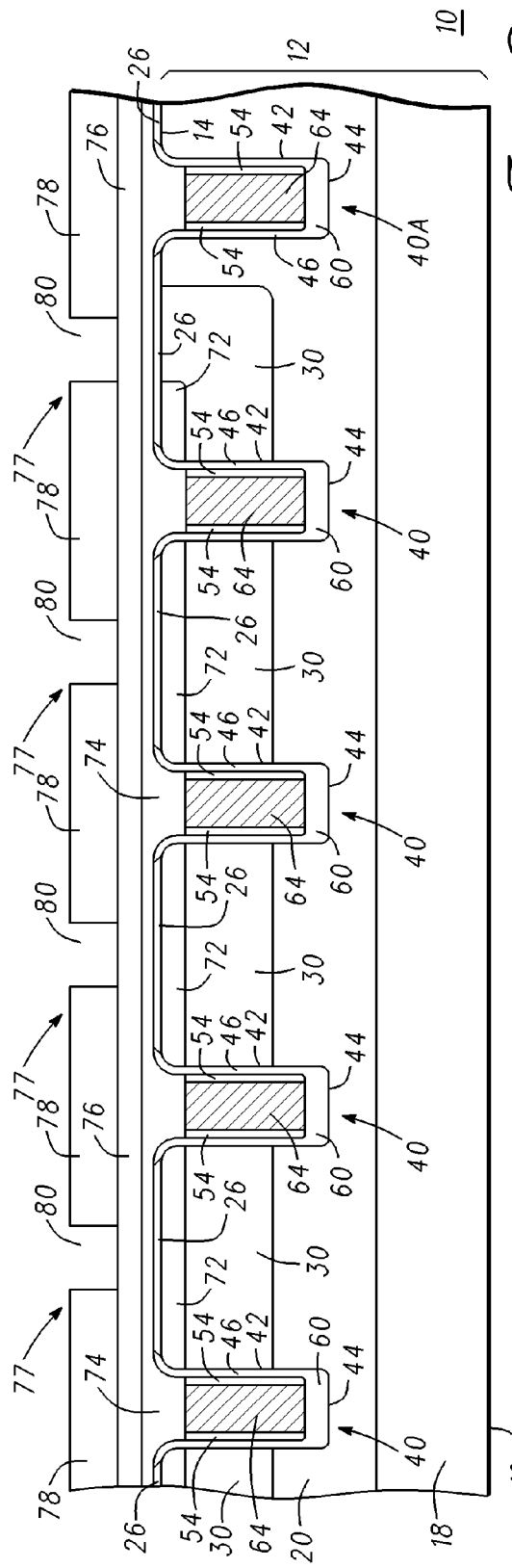

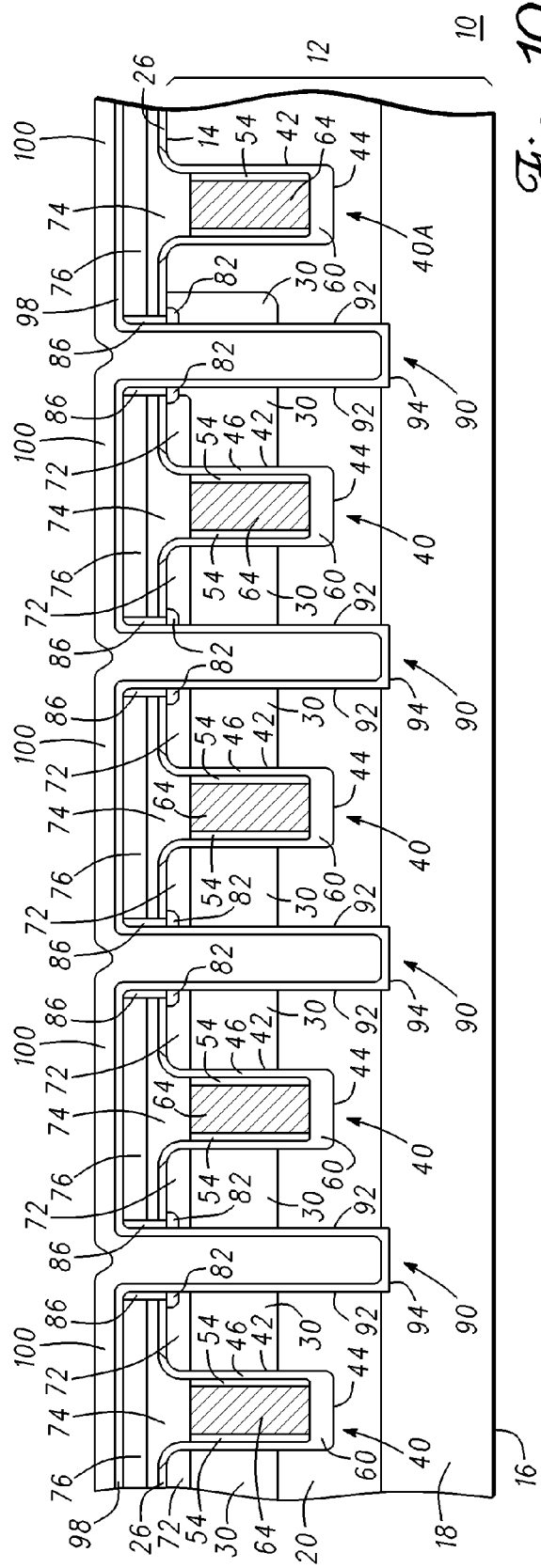
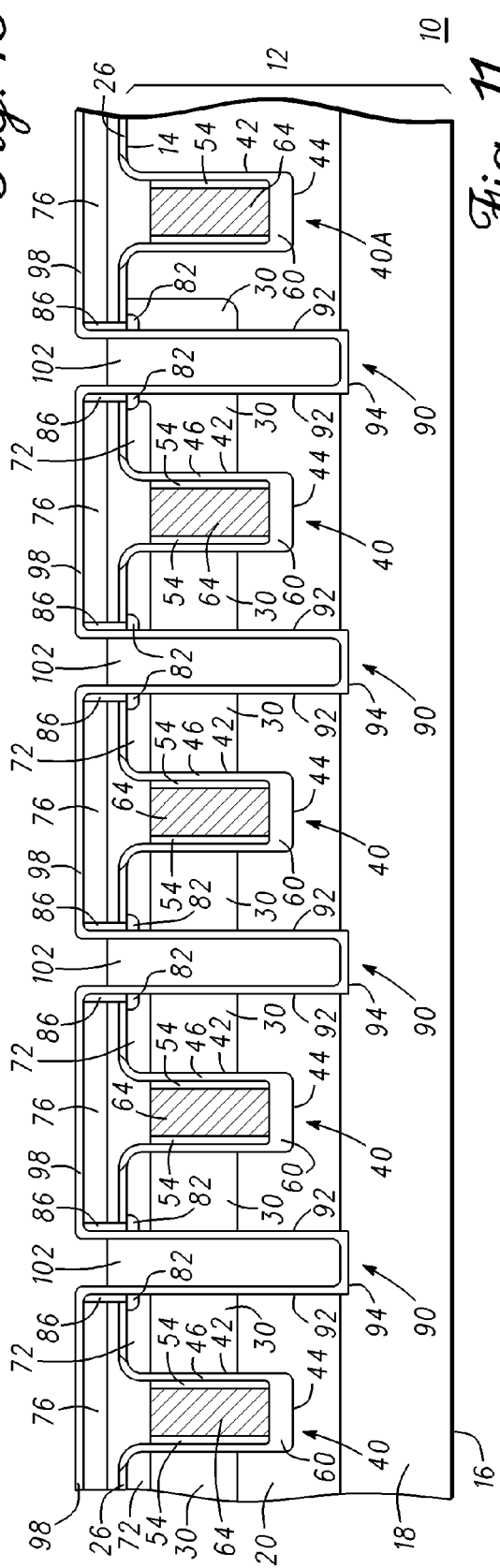

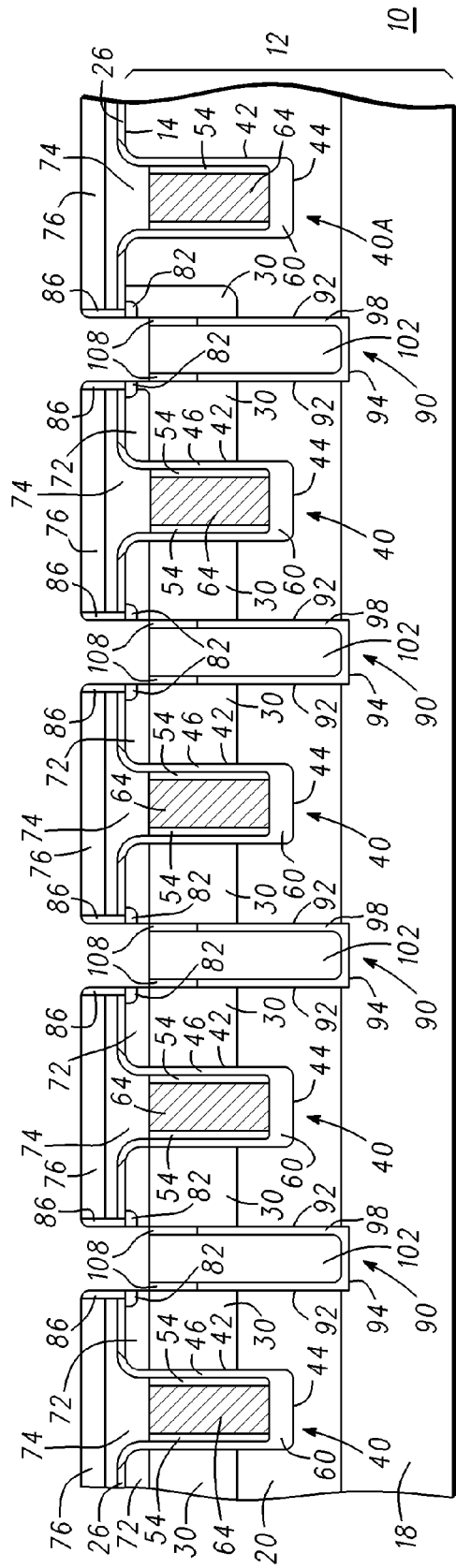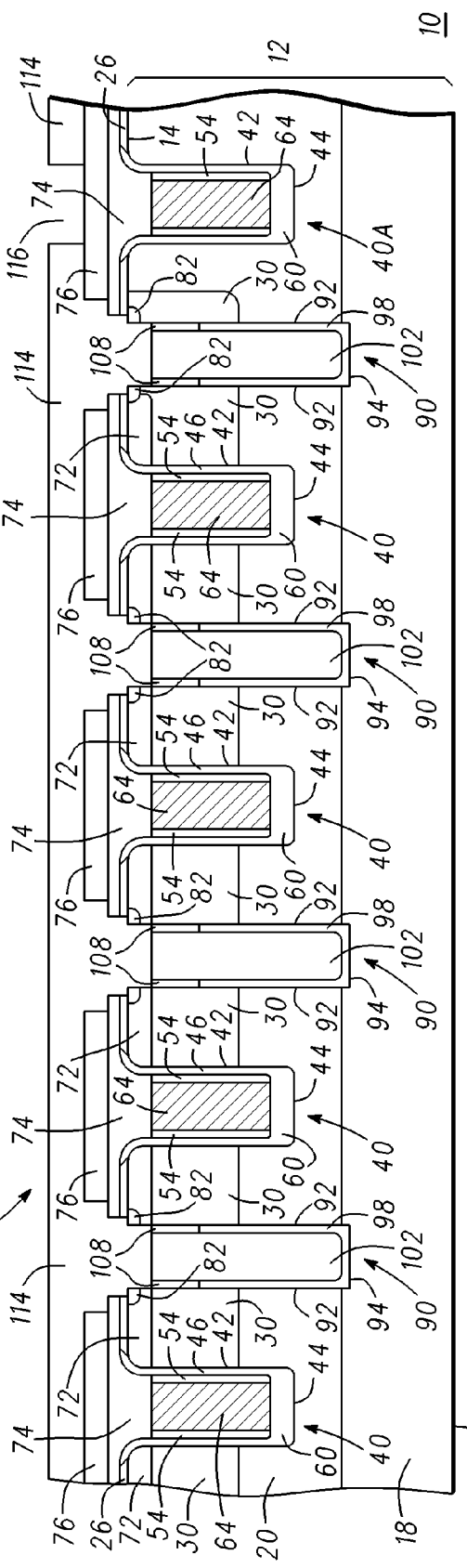

SEMICONDUCTOR COMPONENT AND METHOD OF MANUFACTURE

TECHNICAL FIELD

The present invention relates, in general, to semiconductor components and, more particularly, to power switching semiconductor components.

BACKGROUND

Metal-Oxide Semiconductor Field Effect Transistors ("MOSFETs") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state. As those skilled in the art are aware, MOSFETs can be P-channel field effect transistors, N-channel field effect transistors, depletion mode devices, etc.

Today's high voltage power switch market is driven by two major parameters: breakdown voltage ("BVdss") and on-state resistance ("Rdson"). For a specific application, a minimum breakdown voltage is required, and in practice, designers typically can meet a BVdss specification. However, this is often at the expense of Rdson. This trade-off in performance is a major design challenge for manufacturers and users of high voltage power switching devices. Another challenge arises because Power MOSFET devices have an inherent P-N diode between a P-type conductivity body region and an N-type conductivity epitaxial region. This inherent P-N diode turns on under certain operating conditions and stores charge across the P-N junction. When a sudden reverse bias is applied to the P-N diode, the stored charge produces a negative current flow until the charge is completely depleted. The time for the charge to become depleted is referred to as the reverse recovery time ("Trr") and delays the switching speed of the power MOSFET devices. In addition, the stored charge ("Qrr") also causes a loss in the switching voltage levels due to the peak reverse recovery current ("Irr") and the reverse recovery time.

A technique for reducing Rdson and improving switching speed is to form a trench gate structure and a field plate in the same trench where the trench gate structure is above the field plate within the trench. The trench gate is tied to the source. A drawback with this configuration is that it uses complicated and costly processing techniques.

Accordingly, it would be advantageous to have a semiconductor component that has a lower Rdson with a higher breakdown voltage and lower switching losses, i.e., lower Qrr losses, and a method for manufacturing the semiconductor component. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which:

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a cross-sectional view of the semiconductor component of FIG. 4 at a later stage of manufacture;

FIG. 6 is a cross-sectional view of the semiconductor component of FIG. 5 at a later stage of manufacture;

FIG. 7 is a cross-sectional view of the semiconductor component of FIG. 6 at a later stage of manufacture;

FIG. 8 is a cross-sectional view of the semiconductor component of FIG. 7 at a later stage of manufacture;

FIG. 9 is a cross-sectional view of the semiconductor component of FIG. 8 at a later stage of manufacture;

FIG. 10 is a cross-sectional view of the semiconductor component of FIG. 9 at a later stage of manufacture;

FIG. 11 is a cross-sectional view of the semiconductor component of FIG. 10 at a later stage of manufacture;

FIG. 14 is a cross-sectional view of the semiconductor component of FIG. 13 at a later stage of manufacture;

FIG. 15 is a cross-sectional view of the semiconductor component of FIG. 14 at a later stage of manufacture;

DETAILED DESCRIPTION

Generally, the present invention provides a semiconductor component that includes a field plate and a semiconductor device such as a field effect transistor or a trench field effect transistor, a vertical power field effect transistor, a power field effect transistor, or combinations thereof. It should be noted that a power field effect transistor is also referred to as a vertical power device and a vertical field effect transistor is also referred to as a power device. In accordance with an embodiment, a semiconductor component is manufactured by providing a semiconductor material that is preferably comprised of an epitaxial layer having a body region formed on a substrate. A gate trench is formed in the semiconductor material and extends through the body region. A gate structure is formed in the gate trench. A source region is formed in a portion of the epitaxial layer that is laterally adjacent to the gate trench. A separate field plate trench having sidewalls and a floor is formed in the semiconductor material and extends through the source region and the body region. An electrically conductive material is formed in and spaced apart from the sidewalls of the field plate trench by a layer of dielectric material. A self-aligned merged or unitary electrical contact is made to the body region, the source region, and the trench field plate. Because the electrical contact is a self-aligned unitary structure, it decreases the sizes of the transistors making up the semiconductor component.

In accordance with another embodiment, the semiconductor component comprises a gate trench containing a gate structure and a separate field plate trench containing a field plate. A body region is between the gate trench and the field plate trench and a source region is in the body region. A self-aligned merged or unitary contact is in contact with the body region, the source region, and the field plate.

Figure 1:
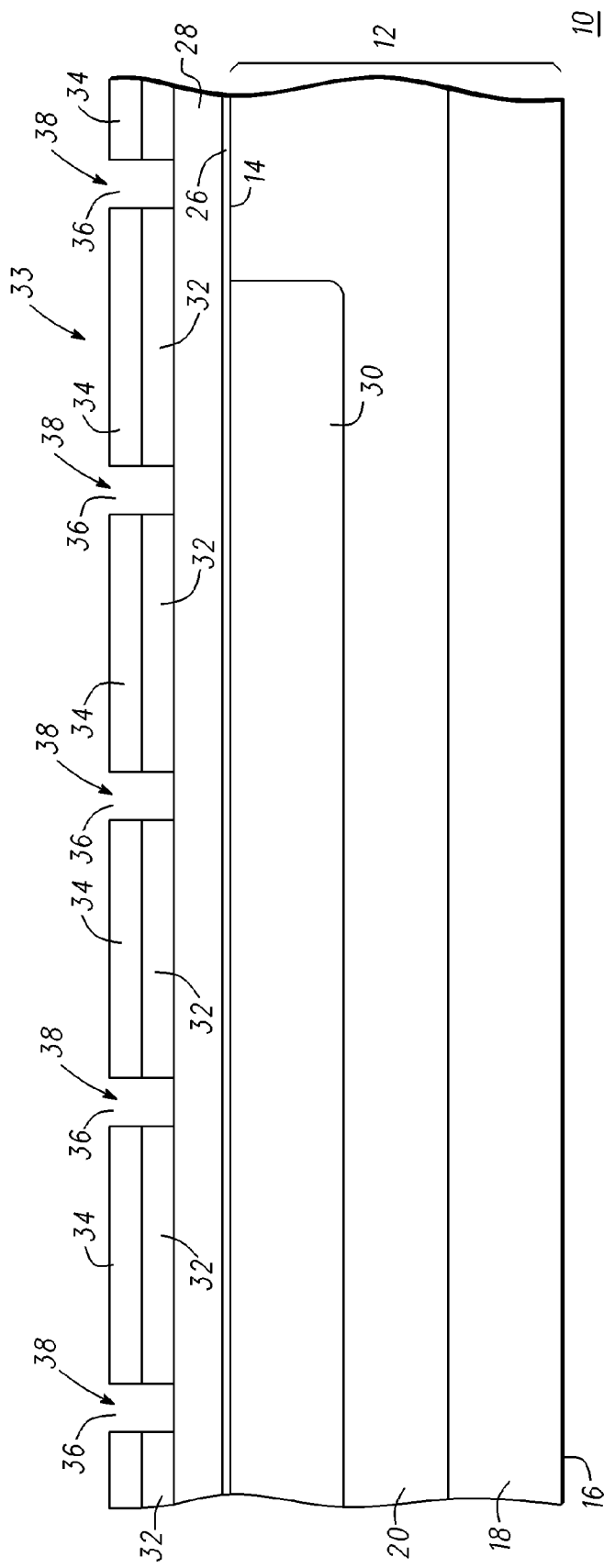
FIG. 1 is a cross-sectional view of a semiconductor component taken along the region indicated by section line 1-1 of FIG. 18 at an early stage of manufacture in accordance with an embodiment of the present invention.

FIG. 1 is a cross-sectional view of a portion of a semiconductor component 10 during manufacture in accordance with an embodiment of the present invention. It should be noted that the cross-sectional view shown in FIG. 1 is taken along the region illustrated by section line 1-1 shown in FIG. 18, but at an earlier stage of manufacture than the illustration of FIG. 18. What is shown in FIG. 1 is a semiconductor material 12 having opposing surfaces 14 and 16. Surface 14 is also referred to as a front or top surface and surface 16 is also referred to as a bottom or back surface. In accordance with an embodiment, semiconductor material 12 comprises an epitaxial layer 20 that is disposed on a semiconductor substrate 18. Preferably, substrate 18 is silicon that is heavily doped with an N-type dopant or impurity material and epitaxial layer 20 is silicon that is lightly doped with an N-type dopant. The resistivity of substrate layer 18 may be less than about 0.01 Ohm-centimeters ($\Omega$-cm) and the resistivity of epitaxial layer 20 may be greater than about 0.1 $\Omega$-cm. Substrate layer 18 provides a low resistance conduction path for the current that flows through a power transistor and a low resistance electrical connection to a bottom drain conductor that is formed on bottom surface 16 of semiconductor material 12, a top drain conductor, or both. A region or layer doped with an N-type dopant is referred to as a region having an N-type conductivity or an N conductivity type and a region or layer doped with a P-type dopant is referred to as a region having a P-type conductivity or a P conductivity type. N-type dopants are also referred to as N-type impurity materials and P-type dopants are also referred to as P-type impurity materials.

A layer of dielectric material 26 is formed on or from epitaxial layer 20. In accordance with an embodiment, the material of dielectric layer 26 is silicon dioxide having a thickness ranging from about 200 Angstroms (Å) to about 1,000 Å. Techniques for forming silicon dioxide layer 26 are known to those skilled in the art. An implant mask (not shown) is formed on dielectric layer 26. By way of example, the implant mask is photoresist having openings that expose portions of dielectric layer 26. A P-type conductivity dopant layer (not shown) is formed in epitaxial layer 20. The dopant layer may be formed by implanting an impurity material such as, for example, boron into epitaxial layer 20. The boron may be implanted at a dose ranging from about $1\times10^{13}$ ions per centimeter squared (ions/cm$^2$) to about $1\times10^{14}$ ions/cm$^2$ and an implant energy ranging from about 100 kilo electron volts (keV) to about 400 keV. The technique for forming the dopant layer is not limited to an implantation technique. The masking structure is removed.

A protective layer 28 is formed on dielectric layer 26. Protective layer 28 may be silicon nitride having a thickness ranging from about 500 Å to about 2,000 Å. In accordance with an embodiment, dielectric layer 26 has a thickness of about 300 Å and protective layer 28 has a thickness of about 1,000 Å. Preferably, the materials of layers 26 and 28 are selected so that protective layer 28 restricts oxygen diffusion and therefore protects underlying layers from oxidation. Although protective layer 28 is shown as a single layer of material, it can also be a multi-layered structure of different material types. Epitaxial layer 20 is annealed by heating to a temperature ranging from about 1,000 Degrees Celsius (° C.) to about 1,200° C. Annealing epitaxial layer 20 drives in the impurity material of the dopant layer to create a dopant region 30, which is also referred to as a body region.

A layer of dielectric material 32 having a thickness ranging from about 1,000 Å to about 5,000 Å is formed on protective layer 28. Dielectric layer 32 serves as a hardmask. By way of example the dielectric material of layer 32 is oxide formed by the decomposition of tetraethylorthosilicate (TEOS) having a thickness of about 2,000 Å. Oxide layers formed by the decomposition of TEOS are referred to as TEOS layers. Alternatively, TEOS layer 32 may be referred to as a hardmask layer or a TEOS hardmask layer. A layer of photoresist is patterned over TEOS layer 32 to form a masking structure 33 having masking elements 34 and openings 36 that expose portions of TEOS layer 32. Masking structure 34 is also referred to as an etch mask. The exposed portions of TEOS layer 32 are removed forming openings 38 that expose portions of protective layer 28. Masking structure 33 is removed.

Referring now to FIG. 2, trenches 40 and 40A having sidewalls 42 and floors 44 are formed in epitaxial layer 20 by removing the exposed portions of protective layer 28, the portions of dielectric layer 26 and epitaxial layer 20 underlying the exposed portions of protective layer 28. It should be noted that for the sake of clarity the reference character "A" has been appended to the trench that is laterally spaced apart from body region 30. Although trench 40A is similar to trenches 40, it serves as a portion of a gate contact. The portions of layers 28, 26, and 20 may be removed using an anisotropic etch technique such as, for example, reactive ion etching. Although trenches 40 and 40A are shown as ending in epitaxial layer 20, this is not a limitation of the present invention. For example, trenches 40 and 40A may extend into substrate 18. The etching technique, the number of trenches, or the shape of the trenches formed in epitaxial layer 20 are not limitations of the present invention. TEOS layer 32 is removed using, for example, a wet stripping technique. Preferably, a sacrificial oxide layer (not shown) having a thickness ranging from about 750 Å to about 1,500 Å is formed on sidewalls 42 and floors 44 of trenches 40 and 40A. By way of example, the sacrificial oxide layer has a thickness of about 1,000 Å. The sacrificial oxide layer is removed using a dilute hydrofluoric acid solution exposing sidewalls 42 and floors 44 of trenches 40 and 40A. A gate dielectric material is formed on sidewalls 42 and floors 44 of trenches 40 and 40A. Preferably, gate dielectric material 46 is oxide having a thickness ranging from about 50 Å to about 300 Å. It should be noted that the width of the openings in protective layer 28 may range from about 0.2 micrometers (μm) to about 1.0 μm and is indicated by arrows 48 and the pitch or distance between adjacent openings in protective layer 28 ranges from about from about 0.8 μm to about 3.0 μm depending upon the desired operating voltage of the device and is indicated by arrows 50.

Referring now to FIG. 3, a layer of electrically conductive material such as, for example, polysilicon 52 having a thickness ranging from about 250 Å to about 1,000 Å is formed on gate oxide layers 46 and over the remaining portions of silicon nitride protective layer 28. For the sake of clarity, the remaining portions of silicon nitride protective layer 28 are collectively referred to as silicon nitride protective layer 28 or protective layer 28. By way of example, polysilicon layer 52 has a thickness of about 500 Å and is doped with an N-type impurity material such as phosphorus. Alternatively, polysilicon layer 52 can be doped with a P-type impurity material such as, for example, arsenic.

Referring now to FIG. 4, polysilicon layer 52 is anisotropically etched to form spacers 54 over the portions of gate oxide layers 46 along sidewalls 42. Polysilicon spacers 54 and gate oxide layers 46 form a gate structure. A layer of dielectric material 56 having a thickness ranging from about 250 Å to about 1,000 Å is formed on polysilicon spacers 54, the portions of gate oxide layers 46 that are over floors 44, and over silicon nitride protective layer 28. In accordance with an embodiment, dielectric layer 56 is silicon nitride having a thickness of about 500 Å.

Referring now to FIG. 5, silicon nitride layer 56 is anisotropically etched to form spacers 58 over polysilicon spacers 54. Techniques for anisotropically etching polysilicon and silicon nitride layers are known to those skilled in the art. A layer of dielectric material having a thickness ranging from about 2,000 Å to about 10,000 Å is grown on the areas not protected by nitride. By way of example, the layer of dielectric material is oxide formed by oxidation in a wet ambient that thickens the dielectric material over floors 44. The thickened oxide layers over floors 44 are identified by reference character 60.

Referring now to FIG. 6, protective layer 28 is removed from oxide layers 26 using a wet etchant that selectively removes the material of protective layer 28, i.e., a wet etchant that removes silicon nitride when protective layer 28 is silicon nitride. In addition, the wet etchant removes silicon nitride spacers 58. A layer 62 of a low electrical resistance material is formed in trenches 40 and 40A and over dielectric layers 46 using, for example, chemical vapor deposition (CVD). Preferably, the low electrical resistance material is a refractory metal silicide such as, for example, tungsten silicide.

Referring now to FIG. 7, tungsten silicide layer 62 is etched back leaving tungsten silicide plugs 64 in trenches 40 and 40A. A layer of photoresist is patterned over tungsten silicide plugs 64, oxide layer 26, and the exposed portions of polysilicon spacers 54 and gate dielectric layers 46 to form a masking structure 66 having masking elements 68 and openings 70 that expose portions of oxide layer 26. Masking structure 66 is also referred to as an implant mask. Then, dopant regions or layers 72 of N-type conductivity are formed in the portions of epitaxial layer 20 that are unprotected by masking elements 68, i.e., in the regions of epitaxial layer 20 underlying the portions of dielectric layer 26 exposed by openings 70. In accordance with an embodiment, dopant regions 72 are formed by implanting an impurity material of N-type conductivity such as, for example, phosphorus or arsenic at a dose ranging from about $1\times10^{14}$ atoms/cm$^2$ to about $5\times10^{16}$ atoms/cm$^2$ and an implant energy ranging from about 20 keV to about 500 keV. Doped regions 72 extend from surface 14 into epitaxial layer 20 a vertical distance that is less than the vertical distance that body regions 30 extend into epitaxial layer 20 and serve as source regions. Masking structure 66 is removed.

Referring now to FIG. 8, a layer of dielectric material 74 having a thickness ranging from about 1,000 Å to about 3,000 Å is formed over oxide layer 26, and the exposed portions of gate dielectric layer 46, polysilicon spacers 54, and tungsten silicide plugs 64. In accordance with an embodiment, the material of dielectric layer 74 is TEOS having a thickness of about 2,000 Å. A layer of silicon nitride 76 having a thickness ranging from about 1,000 Å to about 3,000 Å is formed on TEOS layer 74. Preferably, silicon nitride layer 76 has a thickness of about 2,000 Å. A layer of photoresist is patterned over silicon nitride layer 76 to form a masking structure 77 having masking elements 78 and openings 80 that expose portions of silicon nitride layer 76. Masking structure 77 is also referred to as an etch mask.

Referring now to FIG. 9, the exposed portions of silicon nitride layer 76 and the portions of TEOS layer 74 underlying the exposed portions of silicon nitride layer 76 are removed to form openings exposing portions of epitaxial layer 20 that are between adjacent trenches 40. By way of example, the portions of silicon nitride layer 76 and TEOS layer 74 are removed using an anisotropic reactive ion etch. Optionally, the anisotropic etch may be adjusted so that a portion of TEOS layer 74 remains in the openings to serve as a screen oxide. Masking structure 77 is removed. In accordance with an embodiment, dopant regions 82 are formed by implanting an impurity material of N-type conductivity such as, for example, phosphorus or arsenic into source regions 72 at a dose ranging from about $1\times10^{14}$ atoms/cm$^2$ to about $5\times10^{16}$ atoms/cm$^2$ and an implant energy ranging from about 5 keV to about 30 keV. Dopant regions 82 extend from surface 14 into source regions 72 a vertical distance that is less than the vertical distance that source regions 72 extend into epitaxial layer 20, increase the impurity material concentrations of source regions 72, and serve as source enhancement regions.

Still referring to FIG. 9, a layer of silicon nitride 84 having a thickness ranging from about 250 Å to about 1,000 Å is formed on the exposed portions of epitaxial layer 20 and on silicon nitride layer 76. Preferably, silicon nitride layer 84 has a thickness of about 500 Å.

Referring now to FIG. 10, silicon nitride layer 84 is anisotropically etched to form spacers 86 along silicon nitride layer 76 and TEOS layer 74. Trenches 90 having sidewalls 92 and floors 94 are formed to extend through body regions 30 and epitaxial layer 20 using an anisotropic etch technique such as, for example, reactive ion etching. Although trenches 90 are shown as extending through body regions 30 and epitaxial layer 20 into substrate 18, this is not a limitation of the present invention. For example, trenches 90 may extend through body regions 30 and terminate or end in epitaxial layer 20. Preferably, a trench 90 is formed between adjacent trenches 40. Thus, trenches 90 are interdigitated with trenches 40. A layer of dielectric material 98 having a thickness ranging from about 500 Å to about 10,000 Å is formed on floors 94, along sidewalls 92, along silicon nitride spacers 86, and on silicon nitride layer 76. An electrically conductive layer 100 having a thickness ranging from about 1,000 Å to about 3,000 Å is formed on dielectric layer 98. By way of example, the material of dielectric layer 98 is TEOS having a thickness of about 600 Å within trenches 90 and electrically conductive layer 100 is polysilicon doped with a P-type impurity material such as boron and having a thickness of about 2,000 Å. Alternatively, the material of electrically conductive layer 100 is polysilicon doped with an N-type impurity material or it may be any number of other conductive materials or combination of conductive materials.

Referring now to FIG. 11, polysilicon layer 100 is etched back to form polysilicon plugs 102 in trenches 90. It should be noted that polysilicon plugs 102 are spaced apart from epitaxial layer 20 and dopant regions 30, 72, and 82 by dielectric layer 98 and serve as field plates.

Figure 12:
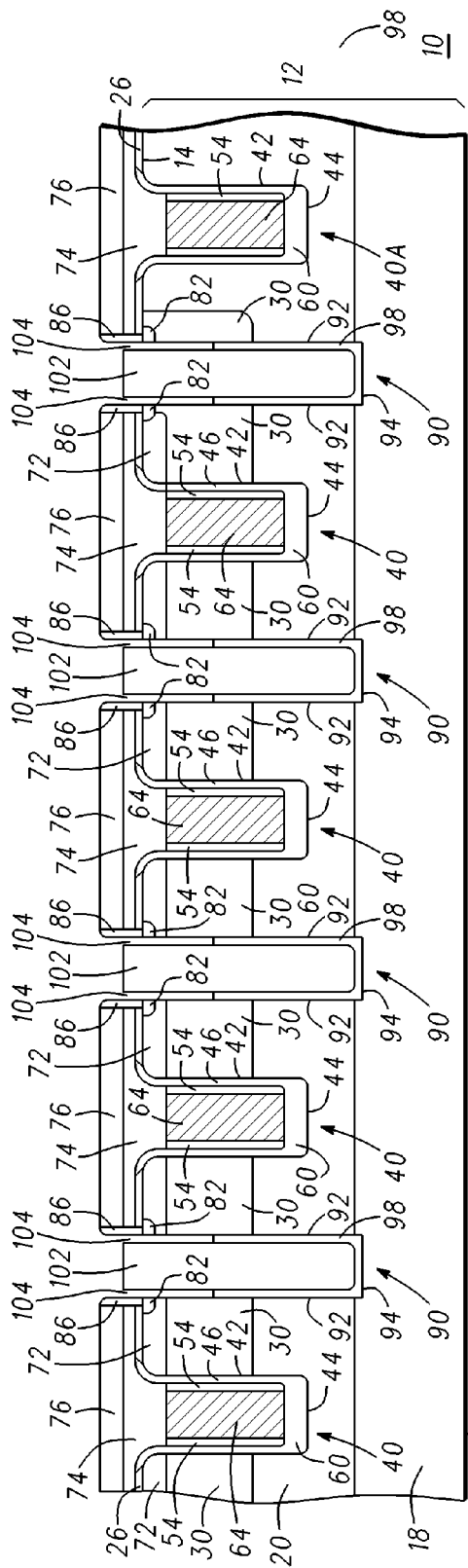
FIG. 12 is a cross-sectional view of the semiconductor component of FIG. 11 at a later stage of manufacture.

Referring now to FIG. 12, dielectric layer 98 is isotropically etched using a wet etchant to recess portions of dielectric layer 98 thereby forming gaps 104 between polysilicon plugs 102 and dopant regions 30, 72, and 82. Preferably, gaps 104 extend vertically from surface 14 to portions of sidewalls 92 that are laterally adjacent to body regions 30. Gaps 104 expose sidewalls of polysilicon plugs 102 and portions of sidewalls 92.

Figure 13:
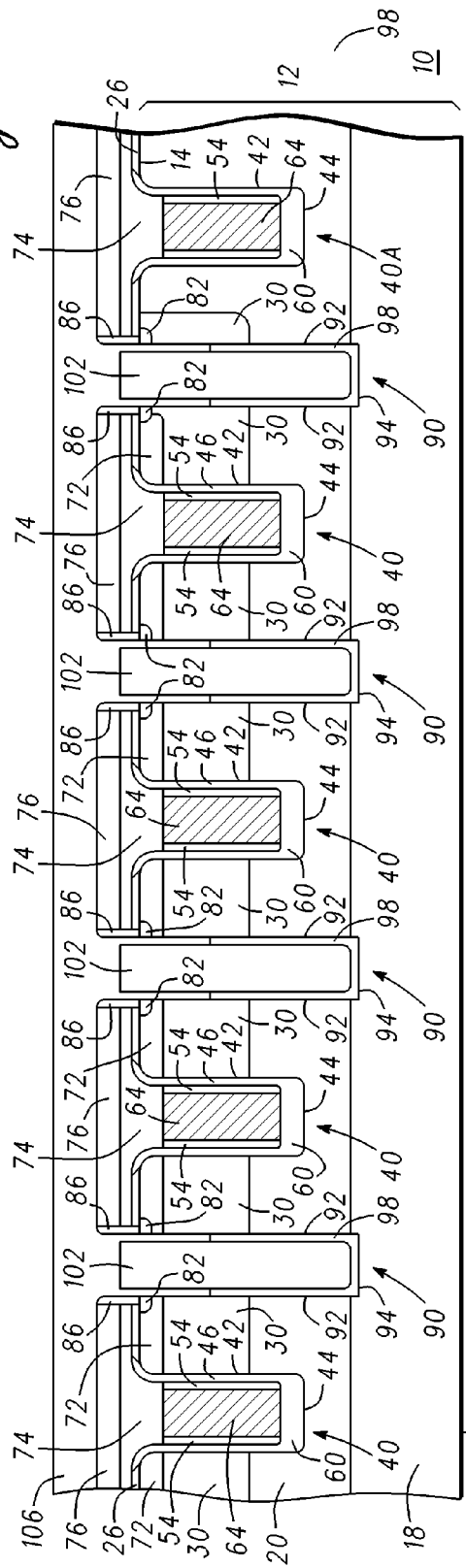
FIG. 13 is a cross-sectional view of the semiconductor component of FIG. 12 at a later stage of manufacture.

Referring now to FIG. 13, a layer of polysilicon 106 having a thickness ranging from about 250 Å to about 1,000 Å is formed in gaps 104, over polysilicon plugs 102 and silicon nitride layer 76, and adjacent to silicon nitride spacers 86. Polysilicon layer 106 may be undoped or it may be doped with an impurity material of N-type conductivity or P-type conductivity. The depth that gaps 104 extend into body regions 30 is not a limitation of the present invention.

Referring now to FIG. 14, polysilicon layer 106 is etched leaving fingers or portions 108 in gaps 104. Portions 108 electrically connect body regions 30 to field plates 102. Preferably, an anneal is performed that laterally diffuses the impurity material from portions 108 into body region 30 and into polysilicon plugs 102.

Referring now to FIG. 15, silicon nitride spacers 86 and portions of silicon nitride layers 76 adjacent to silicon nitride spacers 86 are etched in preparation for forming a staggered step contact region. It should be noted that forming the staggered step contact region is optional. A layer of photoresist is patterned over silicon nitride layer 76, polysilicon plugs 102, polysilicon fingers 108, and the staggered steps to form a masking structure 112 having masking elements 114 and openings 116 that expose portions of silicon nitride layer 76 that are over trench 40A, i.e., the trench that is laterally spaced apart from body regions 30. Masking structure 112 is also referred to as an etch mask. The exposed portion of dielectric layer 76 and the portion of dielectric layer 74 underlying the exposed portion of dielectric layer 76 are anisotropically etched to expose tungsten silicide plug 64 and polysilicon spacers 54 in trench 40A. Masking structure 112 is removed.

Figure 16:
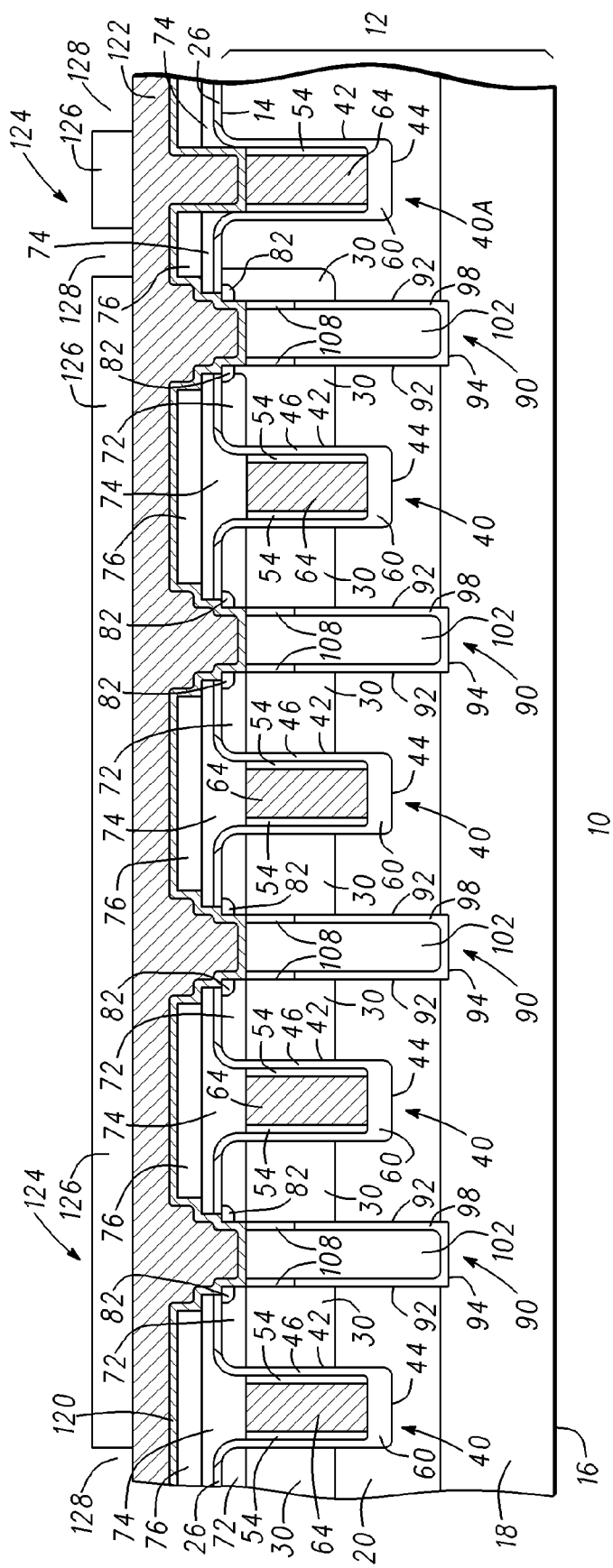
FIG. 16 is a cross-sectional view of the semiconductor component of FIG. 15 at a later stage of manufacture.

Referring now to FIG. 16, a layer of refractory metal 120 is conformally deposited over silicon nitride layers 76, the stagger stepped contact regions, enhanced source regions 82, polysilicon plugs 102, and polysilicon fingers 108. A layer of electrically conductive material 122 is formed over metal layer 120. By way of example, the refractory metal is a titanium-titanium nitride bilayer and electrically conductive layer 122 may be an aluminum alloy having a thickness ranging from about 0.4 um to about 5 um. A layer of photoresist is patterned over electrically conductive layer 122 to form a masking structure 124 having masking elements 126 and openings 128. Masking structure 124 is also referred to as an etch mask. Thus, portions 108 and electrically conductive layers 120 and 122 form a self-aligned electrical connection or contact that electrically connects polysilicon plugs or field plates 102 with body region 30 and source region 72.

Figure 17:
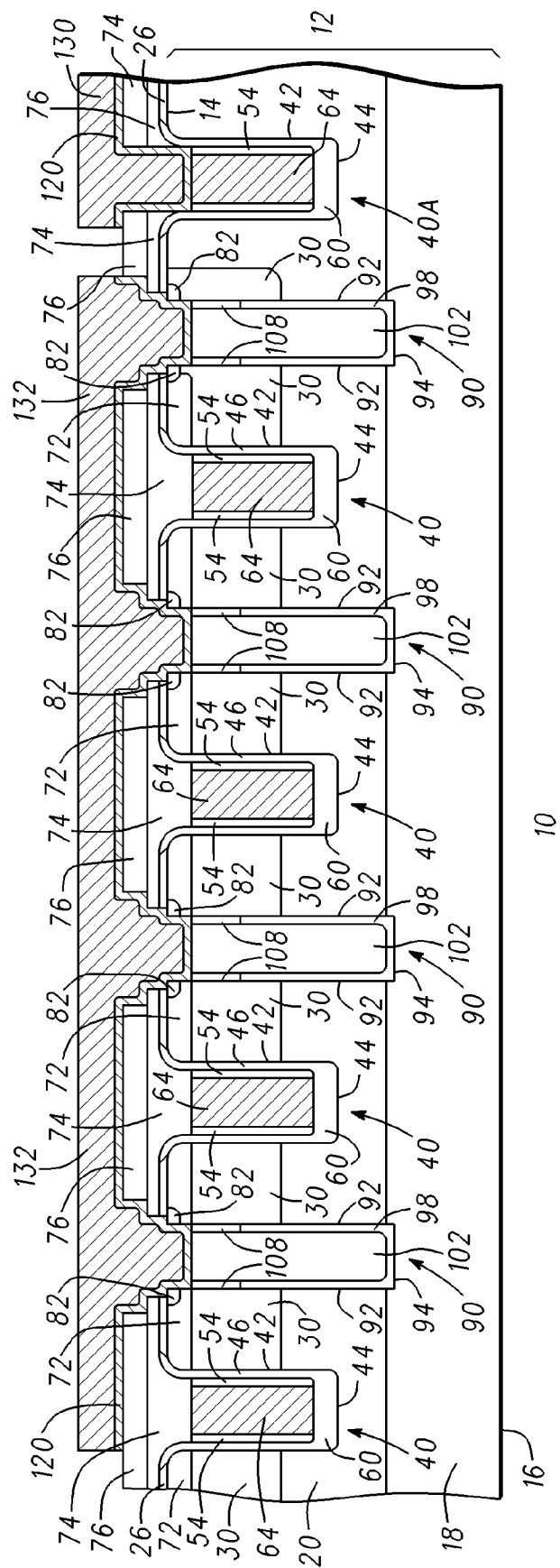
FIG. 17 is a cross-sectional view of the semiconductor component of FIG. 16 at a later stage of manufacture.

Referring now to FIG. 17, the exposed portions of electrically conductive material 122 and the portions of refractory metal layer 120 underlying the exposed portions of electrically conductive material 122 are etched to electrically isolate the gate contact 130 from the source-body-field plate contact 132. Masking structure 124 is removed.

Figure 18:
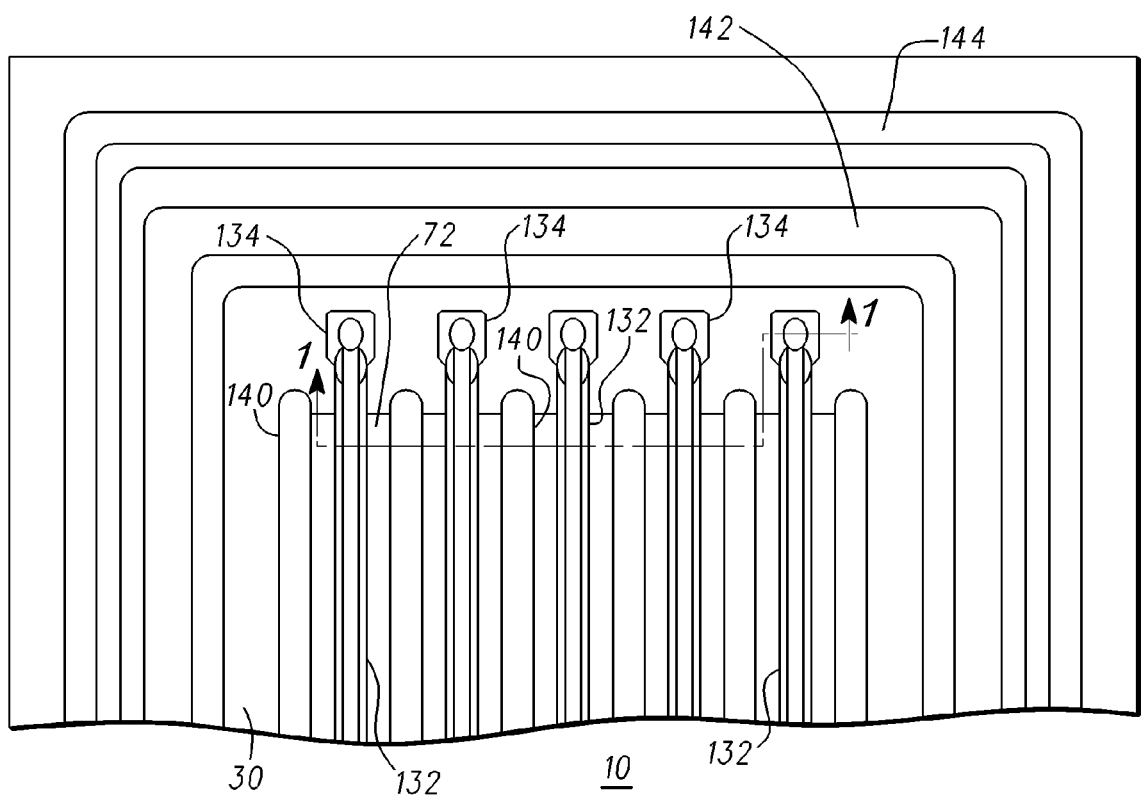
FIG. 18 is a top view of the semiconductor component of FIG. 17.

FIG. 18 is a top view of semiconductor component 10 in accordance with an embodiment of the present invention. What is shown in FIG. 18 are gate regions 132 interdigitated with source-body-field plate contacts 140. Gate regions 132 extend to gate contact contacts 134. In addition, FIG. 18 illustrates a trench termination region 142 and an edge seal contact region 144.

By now it should be appreciated that a semiconductor component 10 having a trench gate structure and a field plate formed in a trench and a method for manufacturing the semiconductor component have been provided. The trench gate structure and the trench for the field plate extend through a body region. Thus, the gate structure and the field plate are formed in separate trenches. In addition, the trench for the field plate extends through a source region. The field plate is electrically connected to the body region and the source region using a self-aligned electrically conductive material. Because the source and body contact is self-aligned within the confines of the field plate trench and the electrically conductive material connects the field plate, the body region and the source region, it is referred to as a unitary self-aligned contact, a unitary self-aligned electrical contact, a merged self-aligned contact, or a merged self-aligned electrical contact. An advantage of using the unitary self-aligned contact is that it allows formation of semiconductor components having small geometries by forming a vertical contact surface instead of a lateral contact surface without using complicated or expensive processing steps.

Although certain preferred embodiments and methods have been disclosed herein, it will be apparent from the foregoing disclosure to those skilled in the art that variations and modifications of such embodiments and methods may be made without departing from the spirit and scope of the invention. For example, the semiconductor devices may be vertical devices or lateral devices. It is intended that the invention shall be limited only to the extent required by the appended claims and the rules and principles of applicable law.

What is claimed is:

1. A method for manufacturing a semiconductor component, comprising:
   providing a semiconductor material having first and second major surfaces and having a body region;
   forming a first trench in the semiconductor material, the first trench having at least one sidewall;
   forming a gate structure in a portion of the first trench;
   forming a source region adjacent the first trench;
   forming a second trench in the semiconductor material, the second trench extending through a portion of the source region and having a sidewall;
   forming a first layer of dielectric material in the second trench;
   forming an electrically conductive material in a portion of the second trench, the electrically conductive material over the first layer of dielectric material in the second trench;
   forming a gap between the semiconductor material and the electrically conductive material in the portion of the second trench by removing a portion of the layer of dielectric material in the second trench;
   forming an electrically conductive structure in the gap; and
   forming a self-aligned electrical connection that contacts the source region, the semiconductor material, the electrically conductive structure in the gap, and the electrically conductive material in the portion of the second trench to electrically connect the electrically conductive material in the second trench with the source region and the body region.

2. The method of claim 1, wherein forming the electrically conductive material in the portion of the second trench includes forming polysilicon over the first layer of dielectric material.

3. The method of claim 2, further including forming silicide over a portion of the polysilicon that is over the first layer of dielectric material.

4. The method of claim 2, further including forming the gap between the polysilicon that is over the first layer of dielectric material and the sidewall of the second trench.

5. The method of claim 4, wherein forming the gap includes removing a portion of the first layer of dielectric material that is between the polysilicon that is over the first layer of dielectric material and the sidewall of the second trench.

6. The method of claim 4, wherein forming the electrically conductive structure in the gap includes forming polysilicon in the gap.

7. The method of claim 6, wherein the polysilicon in the gap is doped with an impurity material of a first conductivity type.

8. The method of claim 7, further including laterally diffusing the impurity material from the polysilicon that is in the gap into the semiconductor material.

9. The method of claim 1, further including enhancing a dopant concentration of a portion of the source region.

10. The method of claim 9, wherein forming the second trench includes forming the second trench through the portion of the source region having the enhanced dopant concentration.

11. The method of claim 1, wherein forming the self-aligned electrical connection that contacts the source region, the semiconductor material, the electrically conductive structure in the gap, and the electrically conductive material in the portion of the second trench includes forming the self-aligned electrical connection as an ohmic contact.

12. A method for manufacturing a semiconductor component, comprising:
   providing a semiconductor material;
   forming a first trench in the semiconductor material;
   forming a gate structure in the first trench;
   forming a doped region of a first conductivity type in a portion of the semiconductor material adjacent the first trench;
   forming a source region in a portion of the doped region;
   forming a field plate adjacent the first trench, the field plate extending into the doped region, wherein forming the field plate comprises:
      forming a second trench in the semiconductor material, the second trench having sidewalls;
      forming a first layer of dielectric material over the sidewalls of the second trench; and
      forming polysilicon over the sidewalls of the second trench;
   recessing a portion of the first layer of dielectric material to form a gap;
   forming an electrically conductive material in the gap; and
   forming a self-aligned electrical interconnect that contacts the source region, the semiconductor material, the electrically conductive material in the gap, and the field plate.

13. The method of claim 12, wherein forming the electrically conductive material in the gap includes forming polysilicon in the gap.

14. The method of claim 13, further including increasing a concentration of the doped region of the first conductivity type.

15. The method of claim 12, wherein forming the self-aligned electrical interconnect that contacts the source region, the semiconductor material, the electrically conductive material in the gap, and the field plate includes forming the self-aligned electrical connection as an ohmic contact.

16. A semiconductor component, comprising:
   a semiconductor material having first and second major surfaces;
   a gate structure extending into the semiconductor material, wherein the gate structure comprises:
      a first trench extending into the semiconductor material from the first major surface, the first trench having sidewalls and a floor;
      a first layer of dielectric material formed on the sidewalls and the floor of the first trench;
      a first electrically conductive material formed on the first layer of dielectric material, and further including a source region adjacent the first trench and extending from the first major surface into the semiconductor material; and wherein the field plate comprises:
      a second trench extending through the source region into the semiconductor material, the second trench having sidewalls and a floor;
      a second layer of dielectric material formed on portions of the sidewalls and over the floor;
      a second electrically conductive material formed on a portion of the second layer of dielectric material;
      a gap filled with a third electrically conductive material, wherein the filled gap is between a portion of the sidewalls of the second trench and the second electrically conductive material; and
   a fourth electrically conductive material in electrical contact with the semiconductor material, the second electrically conductive material, and the third electrically conductive material, wherein the fourth electrically conductive material serves as a self-aligned contact in contact with the field plate and the source regions.

17. The semiconductor component of claim 16, further including:
   a third trench extending into the semiconductor material from the first major surface, the third trench having sidewalls and a floor;
   the first layer of dielectric material formed on the sidewalls and the floor of the third trench;
   the first electrically conductive material formed on the first layer of dielectric material;
   the source region adjacent the third trench and extending from the first major surface into the semiconductor material; and wherein
   the second trench is between the first and third trenches.

18. The semiconductor component of claim 16, wherein the second electrically conductive material and the third electrically conductive material are polysilicon.

19. A method for manufacturing a semiconductor component, comprising:
   providing a semiconductor material having first and second major surfaces and having a body region;
   forming a first trench in the semiconductor material, the first trench having at least one sidewall and extending from the major surface into the semiconductor material a first depth;
   forming a gate structure in a portion of the first trench;
   forming a source region adjacent the first trench;
   forming a second trench in the semiconductor material, the second trench extending through a portion of the source region, having a sidewall, and extending from the major surface into the semiconductor material a second depth, the second depth greater than the first depth;
   forming a first layer of dielectric material in the second trench;
   forming an electrically conductive material in a portion of the second trench over the layer of dielectric material;
   forming a gap between the electrically conductive material in the portion of the second trench and the sidewall of the second trench by removing a portion of the first layer of dielectric material that is between the electrically conductive material that is over the first layer of dielectric material and the sidewall of the second trench;
   forming polysilicon in the gap; and
   forming a self-aligned electrical connection that electrically connects the electrically conductive material in the second trench with the source region and the body region.

* * * * *